(12) United States Patent
Stenfort

(10) Patent No.: US 7,305,603 B1
(45) Date of Patent: Dec. 4, 2007

(54) BOUNDARY SCAN CELL AND METHODS FOR INTEGRATING AND OPERATING THE SAME

(75) Inventor: Ross Stenfort, San Jose, CA (US)

(73) Assignee: Adaptec, Inc., Milpitas, CA (US)

( * ) Notice: Subject to any disclaimer, the term of this patent is extended or adjusted under 35 U.S.C. 154(b) by 528 days.

(21) Appl. No.: 10/762,799

(22) Filed: Jan. 21, 2004

(51) Int. Cl.
*G01R 31/28* (2006.01)
*G06K 5/04* (2006.01)

(52) U.S. Cl. .................. 714/727; 714/700; 714/731

(58) Field of Classification Search ......... 714/718–729
See application file for complete search history.

(56) References Cited

U.S. PATENT DOCUMENTS 5,574,731 A * 11/1996 Qureshi ............ 714/726
6,393,592 B1 * 5/2002 Peeters et al. ........... 714/731
6,813,739 B1 * 11/2004 Grannis, III ............ 714/729
2004/0268181 A1 * 12/2004 Wang et al. ............ 714/30

* cited by examiner

*Primary Examiner*—Cynthia Britt
*Assistant Examiner*—Saqib Siddiqui
(74) *Attorney, Agent, or Firm*—Martine Penilla & Gencarella, LLP

(57) ABSTRACT

An apparatus for performing a boundary scan test is provided, along with method for integrating and operating the same. The apparatus includes an asynchronous flip-flop that has a data input, a data output, a system clock input, a set input, and a reset input. The apparatus also includes a test controller that has a test clock input, a first test data output, and a second test data output. The first test data output of the test controller is connected to the set input of the asynchronous flip-flop. In addition, the second test data output of the test controller is connected to the reset input of the asynchronous flip-flop. The test controller is configured to control the asynchronous flip-flop through the set input and the reset input. The apparatus for performing the boundary scan test avoids introduction of adverse delay and skew effects caused by multiplexing circuitry.

24 Claims, 6 Drawing Sheets

BOUNDARY SCAN CELL AND METHODS FOR INTEGRATING AND OPERATING THE SAME

BACKGROUND OF THE INVENTION

1. Field of the Invention

This invention relates generally to integrated circuits and more particularly to boundary scan cells used for boundary scan testing.

2. Description of the Related Art

Electronic systems typically have one or more printed circuit boards (PCBs) and one or more integrated circuit chips ("chips"). Chips typically include input/output (I/O) pins that are commonly coupled to interconnects of a PCB. Testing the performance of electronic systems, which include PCBs and chips typically require testing at chip level, at board level, and at system level. Testing at board level includes testing interconnects of the PCB. Testing at system level includes analysis of interconnections between chips, PCBs, and other devices.

In order to enhance the testability at board level and system level, a common design practice at chip level now includes incorporating IEEE Standard 1149.1 logic, or Joint Test Action Group (JTAG) logic. In order to incorporate JTAG logic, boundary scan (BS) cells are inserted for all I/O signals and control (i.e., enable) signals for tri-state outputs in the chip design. FIG. 1 is an illustration showing a partial circuit design 100A including a core 101 that communicates with I/O logic to establish a path to a pin 103, in accordance with the prior art. The core is capable of communicating data to a tri-state output buffer 105 and receiving data via an input buffer 107.

FIG. 2 is an illustration showing a partial circuit design 100B after BS cells have been inserted to incorporate JTAG logic into the circuit design, in accordance with the prior art. In this example, three types of BS cells 201, 203, and 205 are used to perform control, output, and input functions, respectively. While the BS cells 201, 203, and 205 provide benefit with respect to enhancing testability, insertion of the BS cells 201, 203, and 205 into the circuit design can introduce adverse timing and skew issues. More particularly, FIGS. 3 and 4 highlight some adverse timing and skew issues associated with insertion of prior art output BS cells.

FIG. 3 is an illustration showing an output BS cell 300, in accordance with the prior art. The output BS cell 300 includes a synchronous flip-flop 301 in communication with a multiplexer (MUX) 303. The synchronous flip-flop 301 includes a data input port D for receiving a data input signal DI and a data output port Q for transmitting an output signal. Also, the synchronous flip-flop 301 includes a clock input port 305 for receiving a system clock signal clk. The output signal is transmitted from the data output port Q of the synchronous flip-flop 301 to a first input of the MUX 303. An output from the MUX 303 is connected to the tri-state output buffer 105, which is in turn connected to the I/O pin 103. Additionally, a test data input TDI is connected from an output of a test access port (TAP) controller to a second input of the MUX 303. The TAP controller receives a test mode select TMS signal and a test clock signal TCK as inputs. The TAP controller logic complies with the IEEE Standard 1149.1.

During normal mode operation, the output BS cell 300 will transmit the data input signal DI maintained in the synchronous flip-flop 301 through the MUX 303 to the tri-state output buffer 105 in accordance with the system clock signal clk. During test mode operation, the output BS cell 300 will transmit the test data input signal TDI through the MUX 303 to the tri-state output buffer 105 in accordance with the test clock signal TCK. The MUX 303 serves to ensure that the proper signal DI or TDI is transmitted to the tri-state output buffer 105 depending on whether the output BS cell 300 is operating in normal mode or test mode, respectively.

While the output BS cell 300 enables boundary scan testing, the output BS cell 300 also adversely affects delay and skew associated with a functional path of data input signal DI to the tri-state output buffer 105 and ultimately the I/O pin 103. The adverse delay and skew effects are caused by insertion of the MUX 303 between the synchronous flip-flop 301 and the tri-state output buffer 105.

Functional path delay is increased by the MUX 303 itself along with additional wire length required to insert the MUX 303. In many cases, a specific amount of time is allowed for getting data out of the I/O pin 103 from when the system clock signal clk is received at the clock input port 305. The additional delay introduced by the MUX 303 can be detrimental in these cases.

Furthermore, skew can be introduced by differences in wire lengths associated with connection of the MUX 303 in various output BS cells 300 around the chip. In other words, differences in wire lengths both before and after the MUX 303, respectively, between the various output BS cells 300 can introduce skew. Some prior art methods for minimizing the skew associated with placement of the MUX 303 have included hand-placing each MUX 303 and developing a macro to place each MUX 303. Though somewhat effective for minimizing skew, these prior art methods do require time, effort, and expense. Also, once the skew issue is minimized, the delay issue remains in full effect.

FIG. 4 is an illustration showing an output BS cell 400, in accordance with the prior art. The output BS cell 400 includes the synchronous flip-flop 301 in communication with a data MUX 401. The data MUX 401 is placed before the synchronous flip-flop 301. As previously mentioned, the synchronous flip-flop 301 includes a data input port D for receiving an input signal and a data output port Q for transmitting an output signal. In the output BS cell 400, the input signal received at the data input port D can be one of the data input signal DI or the test data input signal TDI, depending on the data MUX 401. Also, the synchronous flip-flop 301 includes the clock input port 305 for receiving a clock signal. In the output BS cell 400, the clock signal received at the clock input port 305 can be one of the system clock signal clk or the test clock signal TCK, depending on a clock MUX 403. The output signal is transmitted from the data output port Q of the synchronous flip-flop 301 to the tri-state output buffer 105, which is in turn connected to the I/O pin 103. Additionally, the test data input signal TDI is provided from the TAP controller to a first input of the data MUX 401. Also, a data input signal DI is provided to a second input of the data MUX 401. As previously mentioned, the IEEE Standard 1149.1 TAP controller receives the test mode select TMS signal and the test clock signal TCK as inputs.

During normal mode operation, the data MUX 401 is set to transmit the data input signal DI, and the clock MUX 403 is set to transmit the system clock signal clk. In following, the output BS cell 400 transmits the data input signal DI maintained in the synchronous flip-flop 301 to the tri-state output buffer 105 in accordance with the system clock signal clk. During test mode operation, the data MUX 401 is set to transmit the test data input signal TDI, and the clock MUX 403 is set to transmit the test clock signal TCK. In following, the output BS cell 400 transmits the test data input signal TDI maintained in the synchronous flip-flop 301 to the tri-state output buffer 105 in accordance with the test clock signal TCK.

As with the output BS cell 300 discussed with respect to FIG. 3, the output BS cell 400 also adversely affects delay and skew associated with the functional path of the data input signal DI to the tri-state output buffer 105 and ultimately the I/O pin 103. However, in the case of the output BS cell 400, the adverse delay and skew effects are caused by insertion of both the data MUX 401 and the clock MUX 403, for reasons similar to those described with respect to the output BS cell 300 of FIG. 3.

In view of the foregoing, there is a need for boundary scan apparatus that can be easily incorporated into integrated circuit designs without introducing adverse delay and skew characteristics which could negatively affect either a functional data path or a timing path.

SUMMARY OF THE INVENTION

Broadly speaking, an apparatus for performing a boundary scan test is disclosed along with methods for integrating and operating the same. More specifically, the present invention provides a boundary scan cell that is capable of operating in a normal mode without introducing delay and skew effects that are adverse to data and timing paths. The boundary scan cell of the present invention includes an asynchronous flip-flop having a set input and a reset input that are controlled by a test controller to perform a boundary scan test. During normal mode operation, a data signal is transmitted through the boundary scan cell in accordance with a system clock signal without having to transmit the data signal through multiplexing circuitry. Also, the boundary scan cell configuration does not require the system clock signal to be transmitted through multiplexing circuitry. Thus, the apparatus for performing the boundary scan test as provided by the present invention avoids introduction of adverse delay and skew effects caused by multiplexing circuitry. The boundary scan cell of the present invention can also be integrated to comply with IEEE Standard 1149.1.

In one embodiment, an apparatus for performing a boundary scan test is disclosed. The apparatus includes an asynchronous flip-flop that has a data input, a data output, a system clock input, a set input, and a reset input. The apparatus also includes a test controller that has a test clock input, a first test data output, and a second test data output. The first test data output of the test controller is connected to the set input of the asynchronous flip-flop. In addition, the second test data output of the test controller is connected to the reset input of the asynchronous flip-flop. The test controller is configured to control the asynchronous flip-flop through the set input and the reset input.

In another embodiment, an apparatus for performing a boundary scan test is disclosed. The apparatus includes an asynchronous flip-flop that has a data input, a data output, a system clock input, a set input, and a reset input. The apparatus also includes a test controller that has a test clock input, a first test data output, and a second test data output. The first test data output of the test controller is connected to the set input of the asynchronous flip-flop. In addition, the second test data output of the test controller is connected to the reset input of the asynchronous flip-flop. The test controller is configured to communicate with the asynchronous flip-flop without communicating through intervening multiplexing circuitry.

In another embodiment, a method for integrating a boundary scan cell into a circuit is disclosed. The method includes connecting a data output port of an asynchronous flip-flop to a pin of a boundary scan compatible device. The method also includes connecting a first output port and a second output port of a test controller to a set input port and a reset input port, respectively, of the asynchronous flip-flop. The first output port and the second output port of the test controller are connected to the asynchronous flip-flop without connecting to multiplexing circuitry intervening between the test controller and the asynchronous flip-flop.

In another embodiment, a method for operating a boundary scan cell is disclosed. The method includes communicating a first signal and a second signal from a test controller to an asynchronous flip-flop. The first signal and the second signal are communicated in accordance with a boundary scan timing signal. Also, communication of the first signal and the second signal is performed without having to communicate through a multiplexing circuit. The method further includes receiving the first signal and the second signal at a set input and a reset input, respectively, of the asynchronous flip-flop. A high state of the first signal causes the asynchronous flip-flop to maintain a high state. A high state of the second signal causes the asynchronous flip-flop to maintain a low state. A low state of both the first signal and the second signal causes the asynchronous flip-flop to operate in a normal function mode.

Other aspects of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION

Broadly speaking, an apparatus for performing a boundary scan test is disclosed along with methods for integrating and operating the same. More specifically, the present invention provides a boundary scan cell that is capable of operating in a normal mode without introducing delay and skew effects that are adverse to data and timing paths. The boundary scan cell of the present invention includes an asynchronous flip-flop having a set input and a reset input that are controlled by a test controller to perform a boundary scan test. During normal mode operation, a data signal is transmitted through the boundary scan cell in accordance with a system clock signal without having to transmit the data signal through multiplexing circuitry. Also, the boundary scan cell configuration does not require the system clock signal to be transmitted through multiplexing circuitry. Thus, the apparatus for performing the boundary scan test as provided by the present invention avoids introduction of adverse delay and skew effects caused by multiplexing circuitry. The boundary scan cell of the present invention can also be integrated to comply with IEEE Standard 1149.1.

It should be appreciated that the present invention can be implemented in numerous ways, including as a process, an apparatus, a system, a device, or a method. Several exemplary embodiments of the invention will now be described in detail with reference to the accompanying drawings.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
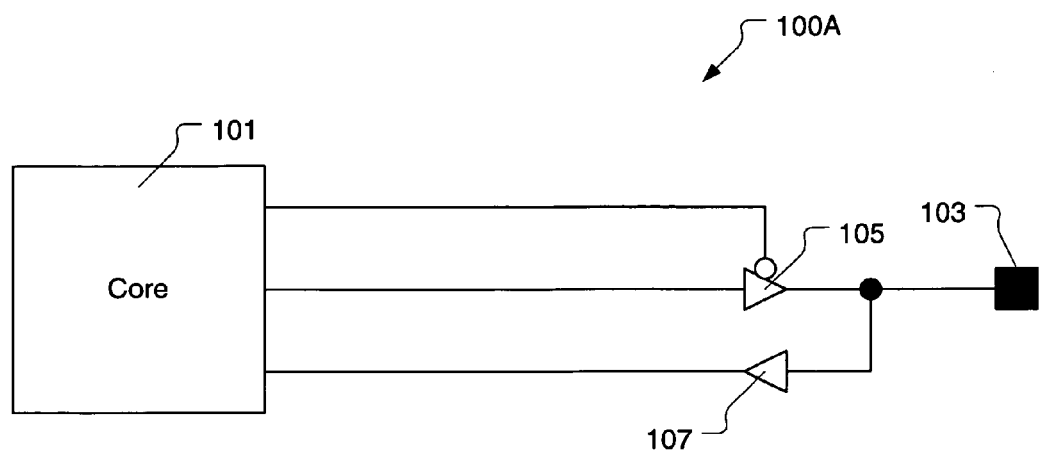
FIG. 1 is an illustration showing a partial circuit design including a core that communicates with I/O logic to establish a path to a pin, in accordance with the prior art.
Figure 2:
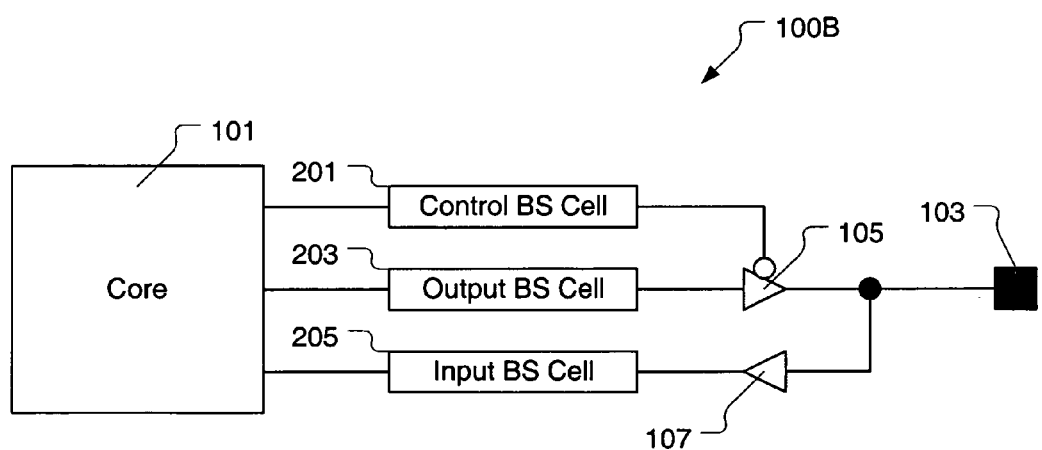
FIG. 2 is an illustration showing a partial circuit design after BS cells have been inserted to incorporate JTAG logic into the circuit design, in accordance with the prior art.
Figure 3:
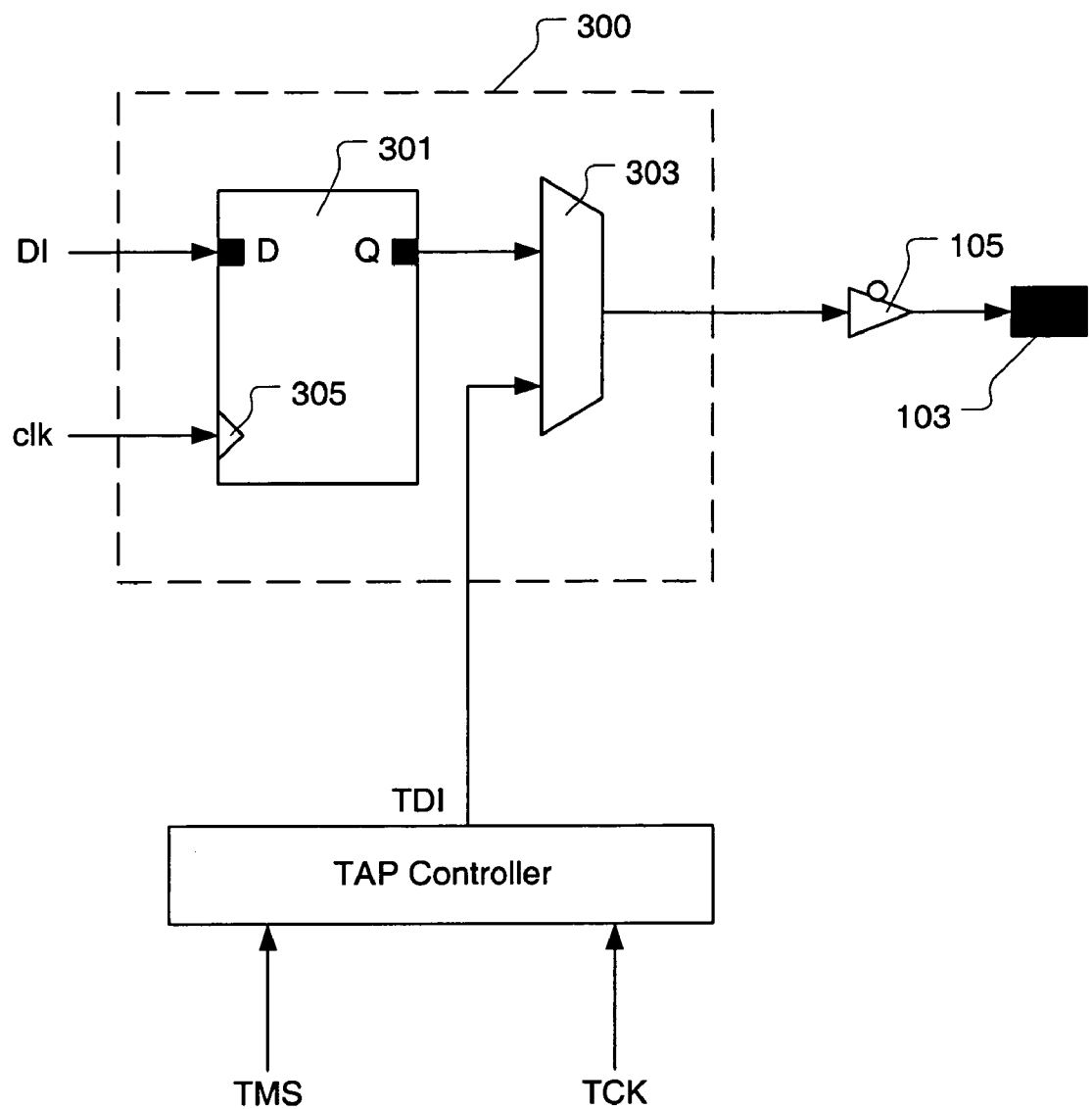
FIG. 3 is an illustration showing an output BS cell, in accordance with the prior art.
Figure 4:
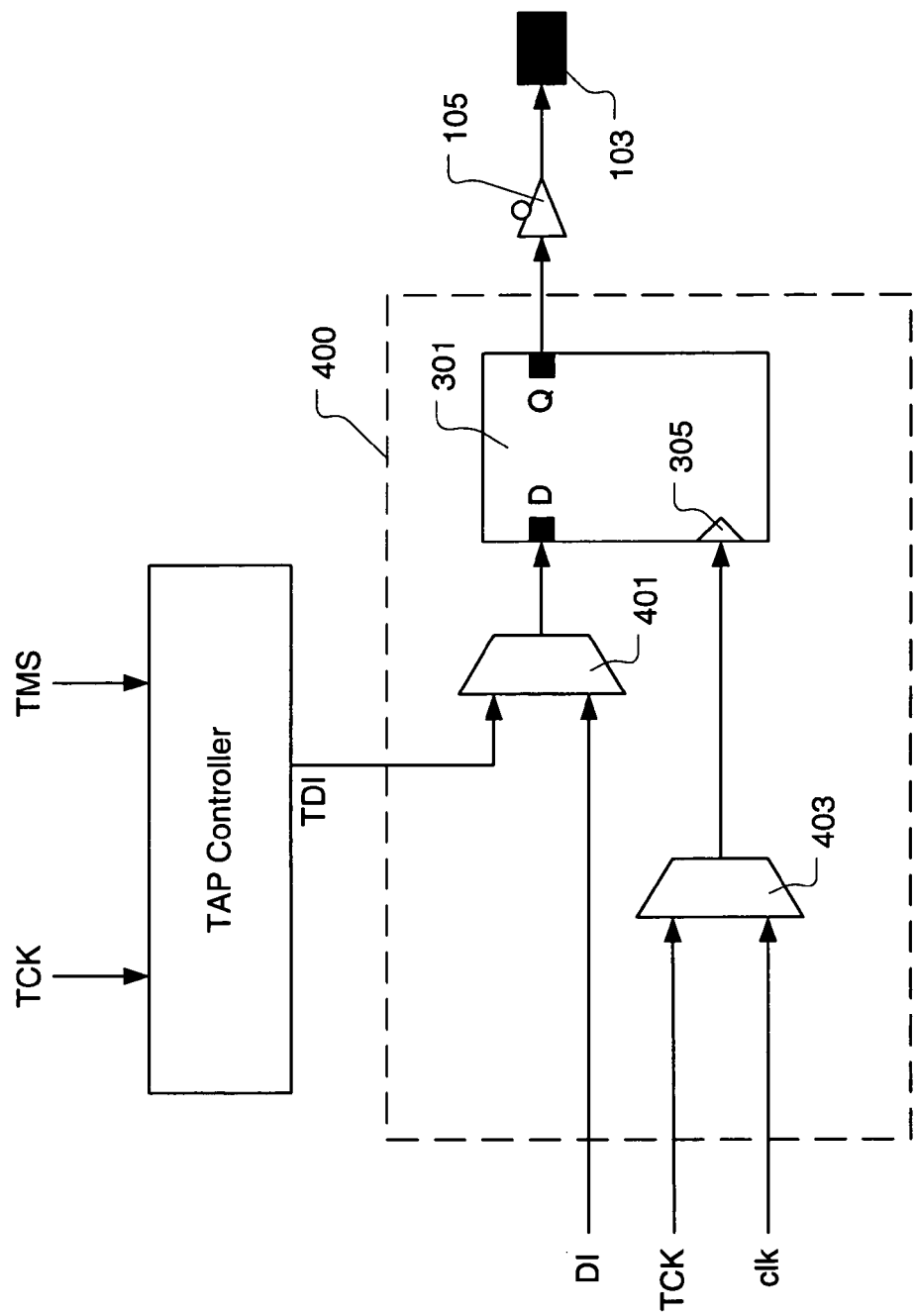
FIG. 4 is an illustration showing an output BS cell, in accordance with the prior art.
Figure 5:
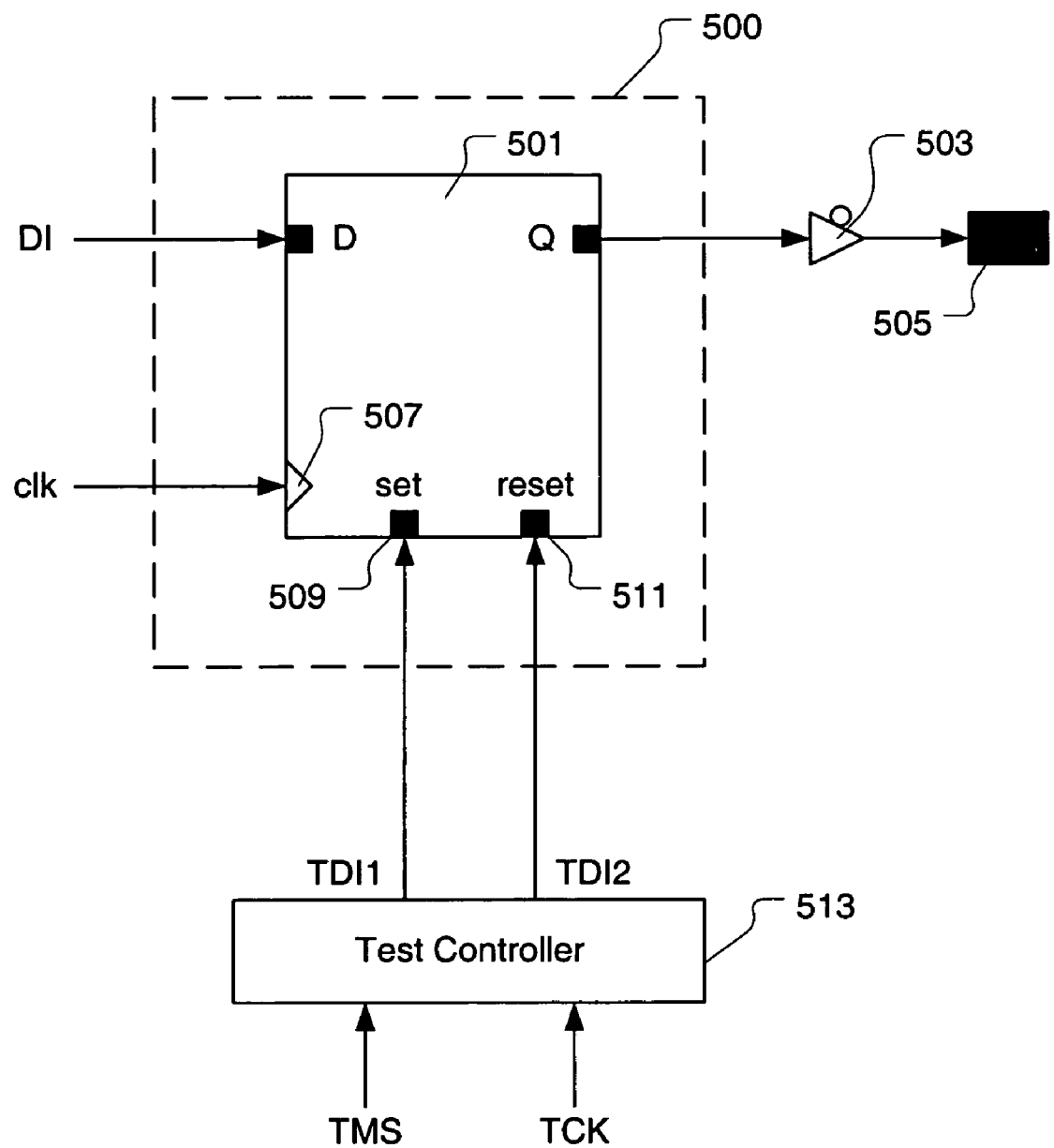
FIG. 5 is an illustration showing an apparatus for performing a boundary scan test, in accordance with one embodiment of the present invention.

FIG. 5 is an illustration showing an apparatus for performing a boundary scan test, in accordance with one embodiment of the present invention. The apparatus includes a boundary scan cell 500 in communication with a test controller 513. The boundary scan cell 500 includes an asynchronous flip-flop 501. The asynchronous flip-flop 501 includes a data input port D, a data output port Q, a system clock input port 507, a set input port 509, and a reset input port 511. The data input port D is configured to receive a data input signal DI. The system clock input port 507 is configured to receive a system clock input signal clk. The data output port Q is configured to provide a data output signal from the asynchronous flip-flop 501 to an input/output (I/O) pin 505. In one embodiment, a driver 503 is disposed outside the boundary scan cell 500 and between the data output port Q and the I/O pin 505. In this embodiment, an input of the driver 503 is connected to the data output port Q and the output of the driver 503 is connected to the I/O pin 505. In one embodiment, the driver 503 is a tri-state buffer.

The test controller 513 is configured to transmit a first test data input signal TDI1 to the set input port 509 of the asynchronous flip-flop 501. The test controller 513 is also configured to transmit a second test data input signal TDI2 to the reset input port 511 of the asynchronous flip-flop 501. The test controller 513 is further configured to receive a test clock input signal TCK and, in one embodiment, a test mode input signal TMS. The test controller 513 is capable of controlling the asynchronous flip-flop 501 of the boundary scan cell 500 through transmission of the first test data input signal TDI1 and the second test data input signal TDI2 to the set input port 509 and the reset input port 511, respectively. In one embodiment, the test controller 513 is compliant with a test access port (TAP) controller of the IEEE Standard 1149.1. In this embodiment, the first test data input signal TDI1 is provided by a Test Data In (TDI) pin of the IEEE Standard 1149.1 compliant TAP controller. Also, in this embodiment, the second test data input signal TDI2 is provided by a Test Reset (TRST) pin of the IEEE Standard 1149.1 compliant TAP controller.

It should be appreciated that the data input signal DI is not required to pass through multiplexing circuitry when entering, traversing, and exiting the boundary scan cell 500. It should also be appreciated that the system clock input signal clk is not required to pass through multiplexing circuitry when entering the boundary scan cell 500. Thus, during a normal function mode, the data input signal DI can be received by the asynchronous flip-flop 501, maintained in the asynchronous flip-flop 501, and transmitted from the asynchronous flip-flop 501, in accordance with the system clock input signal clk, without being delayed or skewed by intervening multiplexing circuitry. Also, during a test mode, the test controller 513 is configured to communicate with the asynchronous flip-flop 501 without communicating through intervening multiplexing circuitry. Accordingly, both the first test data input signal TDI1 and the second test data input signal TDI2 are transmitted to the asynchronous flip-flop 501 without being transmitted through intervening multiplexing circuitry. In one embodiment, the test controller 513 is configured to communicate directly with the asynchronous flip-flop 501.

During test mode operation of the boundary scan cell 500, an assertive signal (i.e., a high signal) will be received by at least one of the set input port 509 and the reset input port 511. Therefore, during test mode operation, at least one of the first test data input signal TDI1 and the second test data input signal TDI2 will be a high signal. Assertion of either the set input port 509 or the reset input port 511 causes the boundary scan cell 500 to function in test mode. In other words, assertion of either the set input port 509 or the reset input port 511 overrides signals incoming at the data input port D and the system clock input port 507. It should be appreciated that both the first and second test data input signals, TDI1 and TDI2, are transmitted from the test controller 513 in accordance with the test clock input signal TCK received by the test controller 513.

The first test data input signal TDI1 and the second test data input signal TDI2 received at the set input port 509 and the reset input port 511, respectively, will determine a signal to be transmitted from the data output port Q. In one embodiment, if the set input port 509 is asserted (i.e., the first test data input signal TDI1 is high) and the reset input port 511 is not asserted (i.e., the second test data input signal TDI2 is low), a high signal will be maintained by the asynchronous flip-flop for transmission through the output data port Q. In a complementary manner, if the set input port 509 is not asserted (i.e., the first test data input signal TDI1 is low) and the reset input port 511 is asserted (i.e., the second test data input signal TDI2 is high), a low signal will be maintained by the asynchronous flip-flop for transmission through the output data port Q. Additionally, in one embodiment, if both the set input port 509 and the reset input port 511 are asserted (i.e., both the first and second test data input signals, TDI1 and TDI2, are high), a high signal will be maintained by the asynchronous flip-flop for transmission through the output data port Q. In this embodiment, the set input port 509 is configured to dominate the reset input port 511. In an alternate embodiment, if both the set input port 509 and the reset input port 511 are asserted (i.e., both the first and second test data input signals, TDI1 and TDI2, are high), a low signal will be maintained by the asynchronous flip-flop for transmission through the output data port Q. In this alternate embodiment, the reset input port 511 is configured to dominate the set input port 509.

When both the set input port 509 and the reset input port 511 are not asserted (i.e., both the first and second test data input signals, TDI1 and TDI2, are low) the boundary scan cell 500 will operate in normal function mode. During normal function mode operation, the asynchronous flip-flop 501 is configured to maintain the data input signal DI having been received at the data input port D in accordance with the system clock input signal clk received at the system clock input port 507. Also, during normal function mode operation, the asynchronous flip-flop 501 is configured to transmit the data input signal DI being maintained in the asynchronous flip-flop 501 to the data output port Q in accordance with the system clock input signal clk received at the system clock input port 507.

Figure 6:
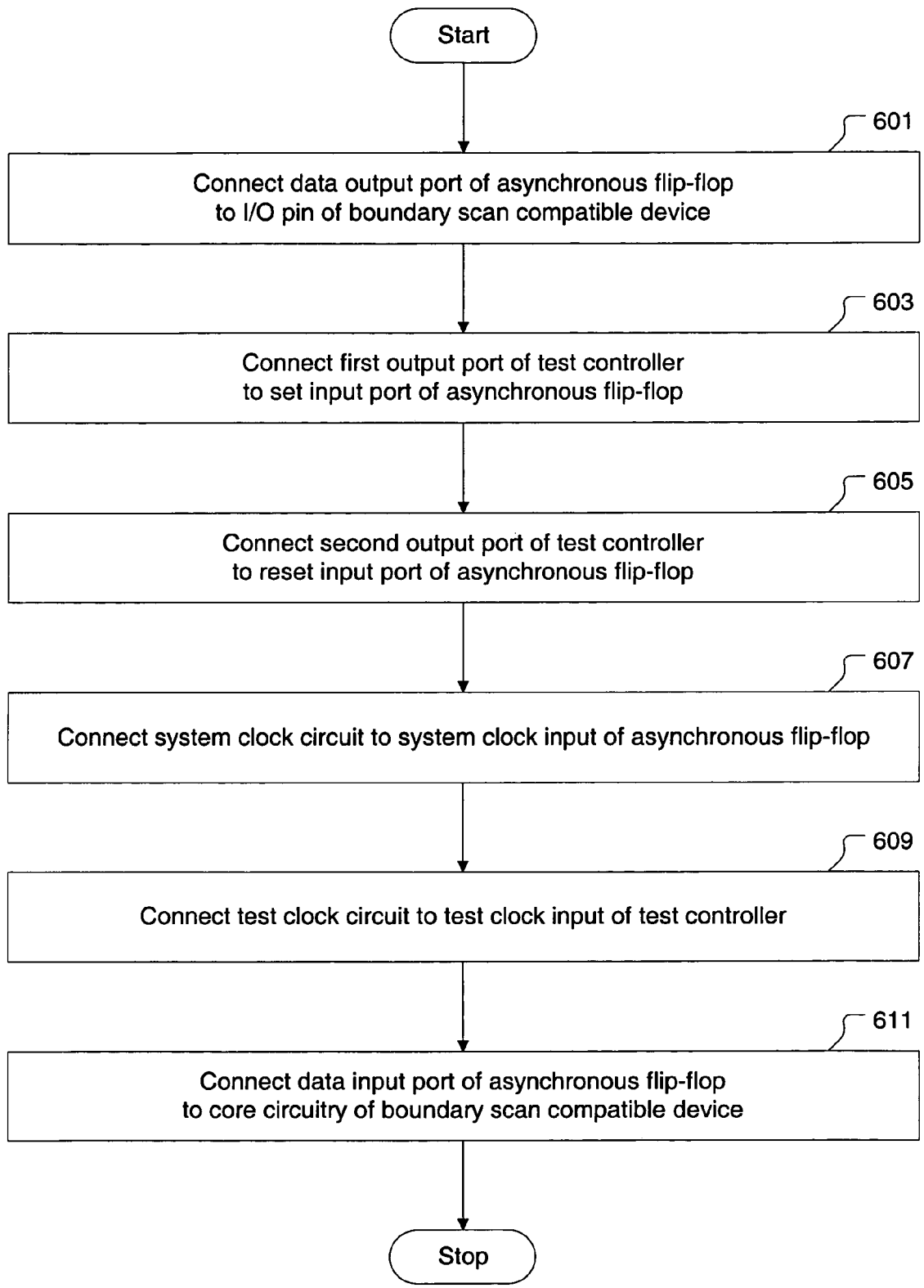
FIG. 6 is an illustration showing a flowchart of a method for integrating a boundary scan cell into a circuit, in accordance with one embodiment of the present invention.

FIG. 6 is an illustration showing a flowchart of a method for integrating a boundary scan cell into a circuit, in accordance with one embodiment of the present invention. The method includes an operation 601 for connecting a data output port of an asynchronous flip-flop to an I/O pin of a boundary scan compatible device. In one embodiment, a driver is interposed between the data output port of the asynchronous flip-flop and the I/O pin. More specifically, the data output port of the asynchronous flip-flop is connected to an input of the driver and the I/O pin is connected to an output of the driver. The method also includes an operation 603 for connecting a first output port of a test controller to a set input port of the asynchronous flip-flop. In an operation 605, a second output port of the test controller is connected to a reset input port of the asynchronous flip-flop. In the operations 603 and 605, the first and second output ports of the test controller are connected to the asynchronous flip-flop without connecting to multiplexing circuitry intervening between the test controller and the asynchronous flip-flop. The method continues with an operation 607 in which a system clock circuit is connected to a system clock input of the asynchronous flip-flop. Also, in an operation 609, a test clock circuit is connected to a test clock input of the test controller. Furthermore, an operation 611 is provided for connecting a data input port of the asynchronous flip-flop to core circuitry of the boundary scan compatible device.

In one embodiment, the test controller in the method of FIG. 6 complies with IEEE Standard 1149.1. In this embodiment, the test controller is a Test Access Port (TAP) controller. Also in this embodiment, the first and second output ports of the test controller correspond to a Test Data In (TDI) pin and a Test Reset (TRST) pin of the TAP controller, respectively. Additionally, in this embodiment, the test clock input of the test controller corresponds to the Test Clock (TCK) pin of the TAP controller.

Figure 7:
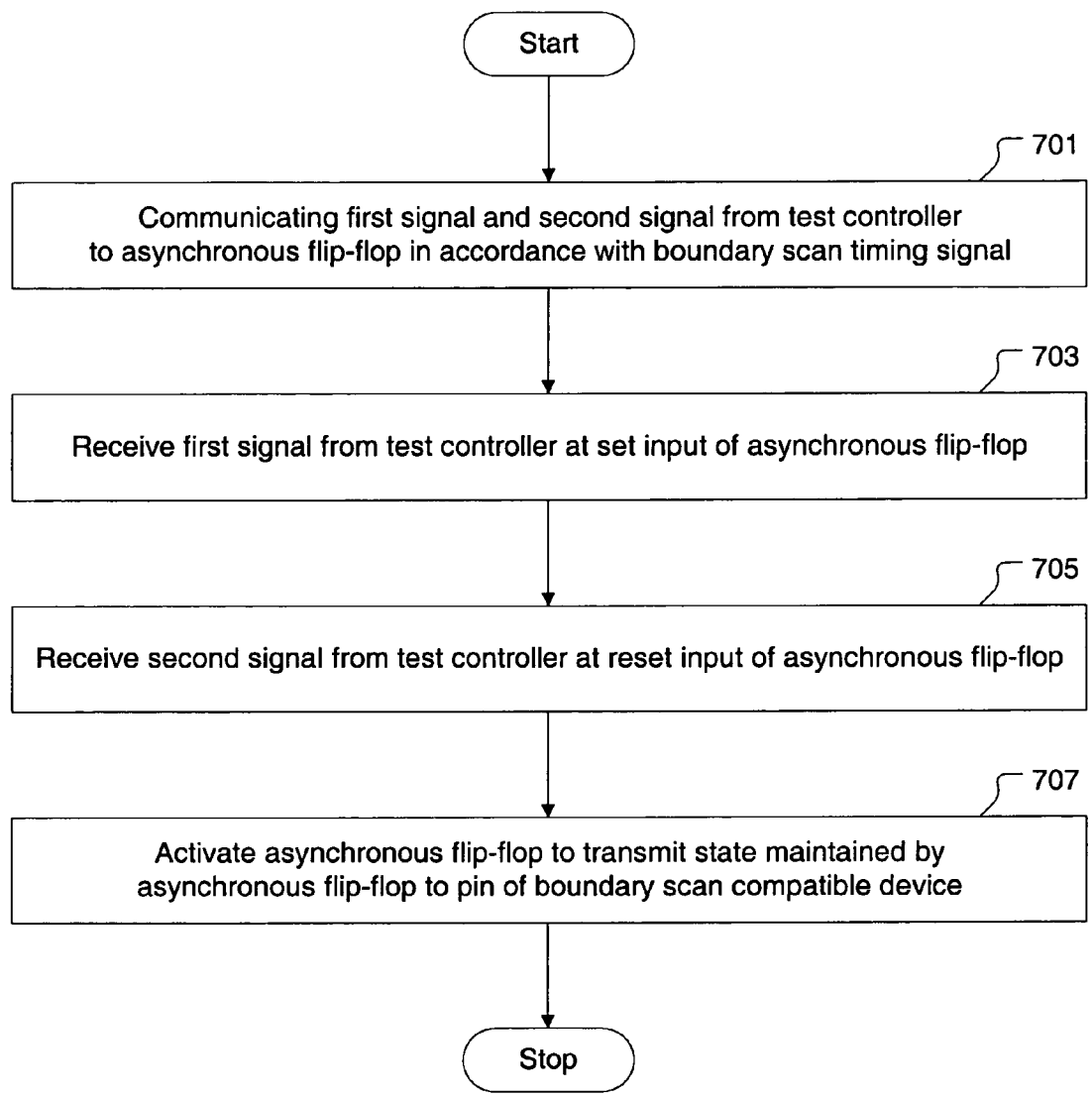
FIG. 7 is an illustration showing a flowchart of a method for operating a boundary scan cell, in accordance with one embodiment of the present invention.

FIG. 7 is an illustration showing a flowchart of a method for operating a boundary scan cell, in accordance with one embodiment of the present invention. The method includes an operation 701 for communicating a first signal and a second signal from a test controller to an asynchronous flip-flop in accordance with a boundary scan timing signal. It should be noted that the first and second signals are communicated from the test controller to the asynchronous flip-flop without having to transmit the first and second signals through a multiplexing circuit intervening between the test controller and the asynchronous flip-flop. The method also includes an operation 703 in which the first signal is received from the test controller at a set input of the asynchronous flip-flop. In an operation 705, the second signal is received from the test controller at a reset input of the asynchronous flip-flop. The method further includes an operation 707 for activating the asynchronous flip-flop to allow a state maintained by the asynchronous flip-flop to be transmitted through a data output of the asynchronous flip-flop to a pin of a boundary scan compatible device.

With reference to operations 703 and 705 of the method, if both the first and second signals received from the test controller are low, the asynchronous flip-flop will operate in a normal function mode. The normal function mode includes receiving a signal at a data input of the asynchronous flip-flop, maintaining the signal within the asynchronous flip-flop, and transmitting the signal to the data output of the asynchronous flip-flop. In normal function mode, receipt and transmission of the signal by the asynchronous flip-flop, as previously described, are performed in accordance with a system clock signal received at a clock input of the asynchronous flip-flop.

With reference to operations 703 and 705 of the method, if at least one of the first signal and the second signal received from the test controller are high, the asynchronous flip-flop will operate in a boundary scan test mode. A high state of the first signal combined with a low state of the second signal will cause the asynchronous flip-flop to maintain a high state. Conversely, a low state of the first signal combined with a high state of the second signal will cause the asynchronous flip-flop to maintain a low state. In one embodiment, simultaneously receiving both the first signal and the second signal in a high state will cause the asynchronous flip-flop to maintain a high state. In this embodiment, the set input is dominate over the reset input of the asynchronous flip-flop. In an alternative embodiment, simultaneously receiving both the first signal and the second signal in a high state will cause the asynchronous flip-flop to maintain a low state. In this alternative embodiment, the reset input is dominate over the set input of the asynchronous flip-flop. In accordance with the aforementioned, a state maintained by the asynchronous flip-flop in response to the high state of at least one of the first and second signals, as received from the test controller, represents a portion of a boundary scan test input. Thus, it should be appreciated that the boundary scan cell can be controlled through the test controller. Furthermore, the test controller can be directed as necessary to perform any number of boundary scan tests.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. An apparatus for performing a boundary scan test of a device, comprising:
    a boundary scan cell defined by an asynchronous flip-flop having a data input connected to receive a data signal from the device during normal operation of the device, a data output connected to an input/output pin of the device, a system clock input connected to receive a system clock signal from the device during normal operation of the device, a set input, and a reset input; and
    a test controller having a test clock input, a first test data output, and a second test data output, the first test data output being connected to the set input of the asynchronous flip-flop, the second test data output being connected to the reset input of the asynchronous flip-flop, the test controller being configured to control the asynchronous flip-flop through the set input and the reset input during test mode operation of the boundary scan cell.

2. An apparatus for performing a boundary scan test as recited in claim 1, wherein the test controller is configured to communicate with the asynchronous flip-flop without communicating through intervening multiplexing circuitry.

3. An apparatus for performing a boundary scan test as recited in claim 1, wherein the test controller is configured to communicate directly with the asynchronous flip-flop.

4. An apparatus for performing a boundary scan test as recited in claim 1, wherein the first test data output of the test controller is capable of asserting the set input of the asynchronous flip-flop, asserting the set input causing a high signal to be maintained by the asynchronous flip-flop.

5. An apparatus for performing a boundary scan test as recited in claim 1, wherein the second test data output of the test controller is capable of asserting the reset input of the asynchronous flip-flop, asserting the reset input causing a low signal to be maintained by the asynchronous flip-flop.

6. An apparatus for performing a boundary scan test as recited in claim 1, wherein the set input is configured to dominate the reset input such that simultaneously asserting both the set input and the reset input causes a high signal to be maintained by the asynchronous flip-flop.

7. An apparatus for performing a boundary scan test as recited in claim 1, wherein the reset input is configured to dominate the set input such that simultaneously asserting both the set input and the reset input causes a low signal to be maintained by the asynchronous flip-flop.

8. An apparatus for performing a boundary scan test as recited in claim 1, wherein the asynchronous flip-flop is configured to transmit a signal received at the data input to the data output in accordance with the system clock input when both the set input and the reset input are not asserted.

9. An apparatus for performing a boundary scan test as recited in claim 1, wherein the test controller is a test access port (TAP) controller compliant with an IEEE 1149.1 standard.

10. An apparatus for performing a boundary scan test as recited in claim 9, wherein the first test data output is a test data in (TDI) pin of the TAP controller.

11. An apparatus for performing a boundary scan test as recited in claim 9, wherein the second test data output is a test reset (TRST) pin of the TAP controller.

12. An apparatus for performing a boundary scan test of a device, comprising:
a boundary scan cell defined by an asynchronous flip-flop having a data input connected to receive a data signal from the device during normal operation of the device, a data output connected to an input/output pin of the device, a system clock input connected to receive a system clock signal from the device during normal operation of the device, a set input, and a reset input; and
a test controller having a test clock input, a first test data output, and a second test data output, the first test data output being connected to the set input of the asynchronous flip-flop, the second test data output being connected to the reset input of the asynchronous flip-flop, the test controller being configured to communicate with the set and reset inputs of the asynchronous flip-flop during test mode operation of the boundary scan cell without communicating through intervening multiplexing circuitry.

13. An apparatus for performing a boundary scan test as recited in claim 12, wherein the first test data output of the test controller is capable of asserting the set input of the asynchronous flip-flop and the second test data output of the test controller is capable of asserting the reset input of the asynchronous flip-flop, asserting the set input causing a high signal to be maintained by the asynchronous flip-flop and asserting the reset input causing a low signal to be maintained by the asynchronous flip-flop.

14. An apparatus for performing a boundary scan test as recited in claim 12, wherein the asynchronous flip-flop is configured to transmit a signal received at the data input to the data output in accordance with the system clock input when both the set input and the reset input are not asserted.

15. A method for integrating a boundary scan cell into a circuit, comprising:
connecting a data input port of an asynchronous flip-flop to receive a data signal from the circuit during normal operation of the circuit;
connecting a data output port of the asynchronous flip-flop to a pin of a boundary scan compatible device;
connecting a first output port of a test controller to a set input port of the asynchronous flip-flop to supply a test data signal from the test controller to the set input port during test mode operation of the boundary scan cell; and
connecting a second output port of the test controller to a reset input port of the asynchronous flip-flop to supply a test data signal from the test controller to the reset input port during test mode operation of the boundary scan cell,
wherein the first output port and the second output port of the test controller are connected to the asynchronous flip-flop without connecting to multiplexing circuitry intervening between the test controller and the asynchronous flip-flop.

16. A method for integrating a boundary scan cell into a circuit as recited in claim 15, further comprising:
interposing a driver between the data output port and the pin, the data output port being connected to an input of the driver and the pin being connected to an output of the driver.

17. A method for integrating a boundary scan cell into a circuit as recited in claim 15, further comprising:
connecting a system clock circuit to a system clock input of the asynchronous flip-flop; and
connecting a test clock circuit to a test clock input of the test controller.

18. A method for operating a boundary scan cell, comprising:
communicating a first signal and a second signal from a test controller to an asynchronous flip-flop in accordance with a boundary scan timing signal, wherein the communicating is performed without having to communicate through a multiplexing circuit, wherein a high state of at least one of the first signal and the second signal causes the asynchronous flip-flop to operate in a boundary scan test mode;
receiving the first signal at a set input of the asynchronous flip-flop; and
receiving the second signal at a reset input of the asynchronous flip-flop,
wherein a high state of the first signal causes the asynchronous flip-flop to maintain a high state, a high state of the second signal causes the asynchronous flip-flop to maintain a low state, and a low state of both the first signal and the second signal causes the asynchronous flip-flop to operate in a normal function mode,
wherein the normal function mode includes transmission of a signal received at a data input of the asynchronous flip-flop to a data output of the asynchronous flip-flop in accordance with a system clock signal received at a clock input of the asynchronous flip-flop.

19. A method for operating a boundary scan cell as recited in claim 18, wherein a state maintained by the asynchronous flip-flop in response to the high state of at least one of the first signal and the second signal represents a portion of a boundary scan test input.

20. A method for operating a boundary scan cell as recited in claim 18, wherein simultaneously receiving both the first signal and the second signal in a high state causes the asynchronous flip-flop to maintain a high state.

21. A method for operating a boundary scan cell as recited in claim 18, wherein simultaneously receiving both the first signal and the second signal in a high state causes the asynchronous flip-flop to maintain a low state.

22. A method for operating a boundary scan cell as recited in claim 18, further comprising:
   activating the asynchronous flip-flop to allow a state maintained by the asynchronous flip-flop to be transmitted through a data output of the asynchronous flip-flop to a pin of a boundary scan compatible device.

23. An apparatus for performing a boundary scan test of a device as recited in claim 1, wherein the set input of the asynchronous flip-flop is only connected to the first test data output of the test controller, and wherein the reset input of the asynchronous flip-flop is only connected to the second test data output of the test controller.

24. An apparatus for performing a boundary scan test of a device as recited in claim 1, wherein the system clock input is connected to receive the system clock signal without communication of the system clock signal through a multiplexer within the boundary scan cell.

* * * * *